(12) United States Patent
Veerasamy et al.

(10) Patent No.: US 6,988,463 B2
(45) Date of Patent: Jan. 24, 2006

(54) ION BEAM SOURCE WITH GAS INTRODUCED DIRECTLY INTO DEPOSITION/VACUUM CHAMBER

(75) Inventors: Vijayen S. Veerasamy, Ann Arbor, MI (US); Rudolph Hugo Petrmichl, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 155 days.

(21) Appl. No.: 10/289,244

(22) Filed: Oct. 18, 2002

(65) Prior Publication Data

US 2004/0074444 A1 Apr. 22, 2004

(51) Int. Cl.
*H01L 21/00* (2006.01)
*C23C 16/00* (2006.01)

(52) U.S. Cl. ............................ 118/723 FI; 118/723 CB; 118/723 EB; 118/723 FE; 118/723 R; 118/723 VE; 118/723 MP; 204/192.1; 204/298.1; 427/562

(58) Field of Classification Search ........... 118/723 CB, 118/723 FI, 723 EB, 723 FE, 723 R, 723 VE, 118/723 MP, 566, 569, 580; 427/562; 204/192.1, 204/298.1
See application file for complete search history.

(56) References Cited

U.S. PATENT DOCUMENTS

| | | | |
|---|---|---|---|
| 2,672,560 A | 3/1954 | Berry | |
| 3,984,692 A | 10/1976 | Arsenault | |
| 4,122,347 A | 10/1978 | Kovalsky et al. | |
| 4,303,865 A | 12/1981 | Swingler | |
| 4,401,539 A | 8/1983 | Abe et al. | |
| 4,434,038 A | 2/1984 | Morrison, Jr. | |
| 4,569,746 A | 2/1986 | Hutchinson | |
| 4,572,776 A | 2/1986 | Aichert et al. | |
| 4,595,482 A | 6/1986 | Mintz | |
| 4,606,806 A | 8/1986 | Helmer | |
| 4,652,795 A | 3/1987 | Lee et al. | |
| 4,657,654 A | 4/1987 | Mintz | |
| 4,661,228 A | 4/1987 | Mintz | |
| 4,677,904 A | 7/1987 | Natsumeda et al. | |
| 4,710,283 A | 12/1987 | Singh et al. | |
| 4,865,710 A | 9/1989 | Aaron et al. | |
| 4,865,712 A | 9/1989 | Mintz | |
| 4,957,605 A | 9/1990 | Hurwitt et al. | |
| 5,106,470 A | 4/1992 | Takei et al. | |
| 5,130,607 A | 7/1992 | Lama | |
| 5,407,551 A | 4/1995 | Sieck et al. | |
| 5,415,754 A | 5/1995 | Manley | |
| 5,423,970 A * | 6/1995 | Kugler ................. 204/298.03 |
| 5,508,368 A * | 4/1996 | Knapp et al. ............... 427/534 |
| 5,656,819 A | 8/1997 | Greenly | |
| 5,736,019 A | 4/1998 | Bernick | |
| 5,865,961 A | 2/1999 | Yokoyama et al. | |
| 5,888,593 A | 3/1999 | Petrmichl et al. | |
| 5,889,371 A | 3/1999 | Boyarsky et al. | |
| 5,973,447 A | 10/1999 | Mahoney et al. | |
| 6,002,208 A | 12/1999 | Maishev et al. | |
| 6,037,717 A * | 3/2000 | Maishev et al. ........ 315/111.91 |
| 6,086,962 A * | 7/2000 | Mahoney et al. ........... 427/577 |
| 6,147,354 A | 11/2000 | Maishev et al. | |
| 6,153,067 A | 11/2000 | Maishev et al. | |
| 6,238,526 B1 | 5/2001 | Maishev et al. | |
| 6,246,059 B1 | 6/2001 | Maishev et al. | |
| 6,261,424 B1 | 7/2001 | Goncharenko et al. | |
| 6,319,326 B1 * | 11/2001 | Koh et al. ................. 118/718 |
| 6,359,388 B1 | 3/2002 | Petrmichl | |
| 6,395,333 B2 | 5/2002 | Veerasamy | |
| RE38,358 E | 12/2003 | Petrmichl | |

* cited by examiner

*Primary Examiner*—P. Hassanzadeh
*Assistant Examiner*—Ram N Kackar
(74) *Attorney, Agent, or Firm*—Nixon & Vanderhye P.C.

(57) ABSTRACT

An ion source is provided wherein depositing gas and/or maintenance gas is/are introduced into the ion source via the vacuum/depositing chamber, thereby reducing the amount (s) of undesirable insulative build-ups on the anode and/or cathode of the source in an area proximate the electric gap between the anode and cathode. In certain embodiments, an insulative and/or dielectric insert(s) and/or layer(s) is/are provided in at least part of an area between the anode and cathode so as to help reduce undesirable insulative build-ups on the anode and/or cathode. More efficient ion source operations is thus achievable.

10 Claims, 5 Drawing Sheets

(PRIOR ART)

Fig. 3

(PRIOR ART)

United States Patent US 6,988,463 B2

ION BEAM SOURCE WITH GAS INTRODUCED DIRECTLY INTO DEPOSITION/VACUUM CHAMBER

Certain embodiments of this invention relate to an ion source wherein a deposit gas and/or a maintenance gas is/are introduced directly into the deposition/vacuum chamber of the source. Thus, in certain example embodiments, ions resulting from the depositing gas for example may be directed toward the target substrate either without having to first proceed through an aperture defined in the cathode and/or between an electric gap between the anode and cathode of the source.

BACKGROUND OF THE INVENTION

An ion source is a device that causes gas molecules to be ionized and then accelerates and emits the ionized gas molecules and/or atoms in a beam toward a substrate. Such an ion beam may be used for various technical and technological purposes, including but not limited to, cleaning, activation, polishing, etching, and/or deposition of thin film coatings. Exemplary ion sources are disclosed, for example, in U.S. Pat. Nos. 6,037,717; 6,002,208; and 5,656,819, the disclosures of which are all hereby incorporated herein by reference.

Figure 1:
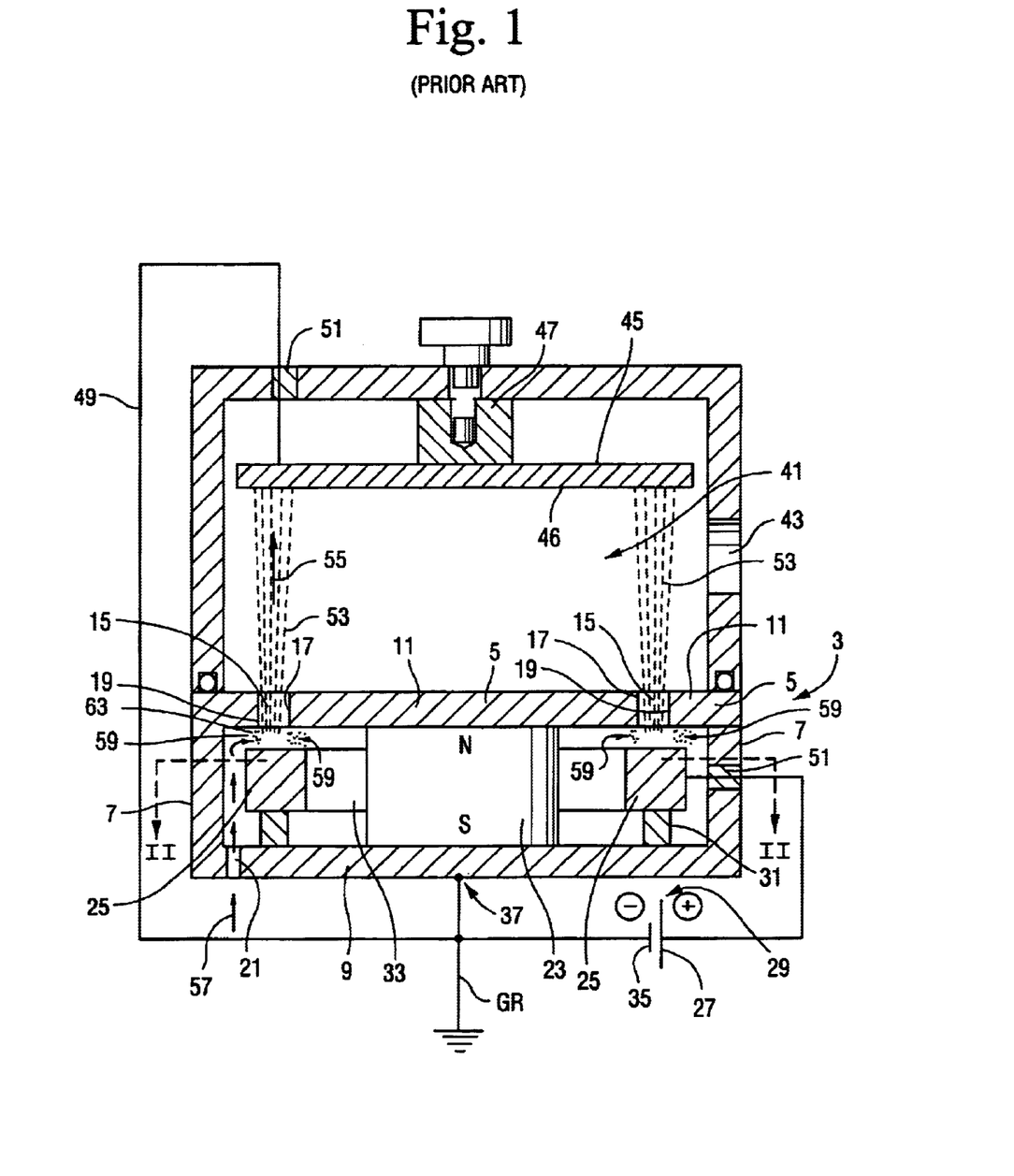
FIG. 1 is a schematic partial cross sectional view of a conventional cold cathode closed drift ion source.
Figure 2:
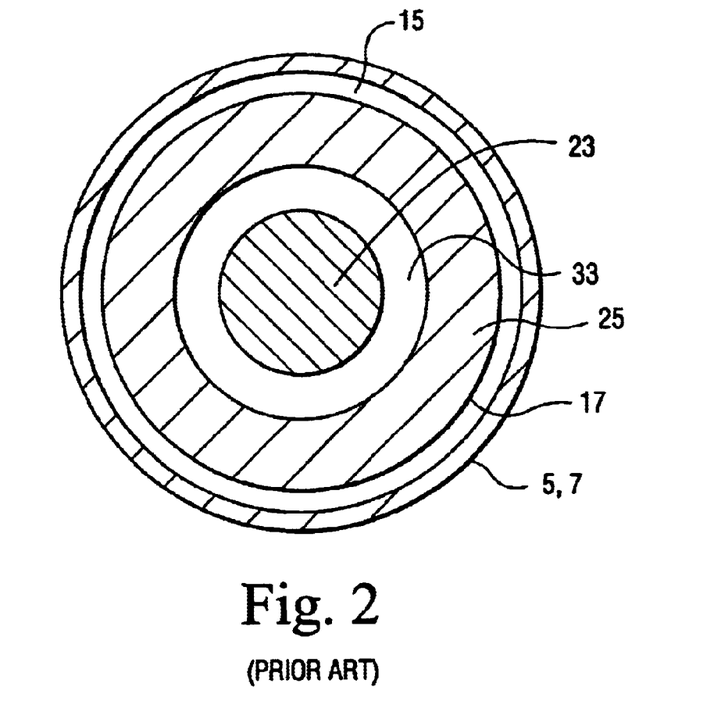
FIG. 2 is a sectional view taken along section line II of FIG. 1.
Figure 3:
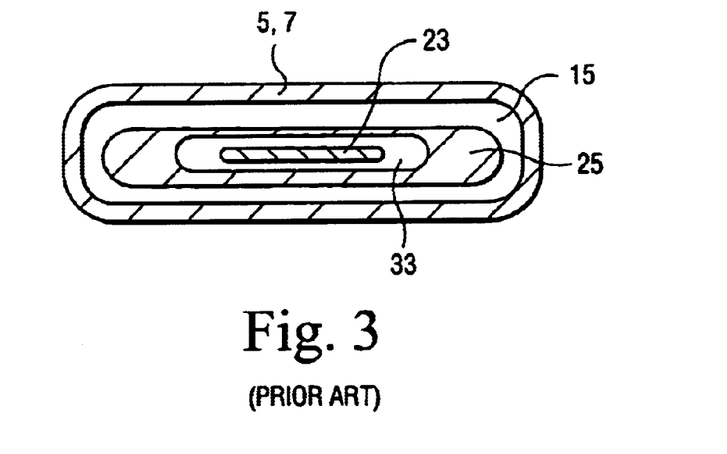
FIG. 3 is a sectional view similar to FIG. 2, taken along section line II in FIG. 1, in another embodiment illustrating that the ion source may be shaped in an oval manner instead of in a circular manner.

FIGS. 1 and 2 illustrate a conventional ion source. In particular, FIG. 1 is a side cross-sectional view of an ion beam source with a circular ion beam emitting slit defined in the cathode, and FIG. 2 is a corresponding sectional plan view along section line II—II of FIG. 1. FIG. 3 is a sectional plan view similar to FIG. 2, for purposes of illustrating that the FIG. 1 ion beam source may have an oval ion beam emitting slit as opposed to a circular ion beam emitting slit.

Referring to FIGS. 1–3, the ion source includes hollow housing 3 made of a magnetoconductive material such as steel, which is used as a cathode 5. Cathode 5 includes cylindrical or oval side wall 7, a closed or partially closed bottom wall 9, and an approximately flat top wall 11 in which a circular or oval ion emitting slit 15 is defined. Ion emitting slit 15 includes an inner periphery 17 as well as an outer periphery 19.

Deposit and maintenance gas supply aperture or hole 21 is formed in bottom wall 9. Flat top wall 11 functions as an accelerating electrode. A magnetic system in the form of a cylindrical permanent magnet 23 with poles N and S of opposite polarity is placed inside housing 3 between bottom wall 9 and top wall 11. The N-pole faces flat top wall 11, while the S-pole faces bottom wall 9 of the ion source. The purpose of the magnetic system, including magnet 23 with a closed magnetic circuit formed by the magnet 23, cathode 5, side wall(s) 7, and bottom wall 9, is to induce a substantially transverse magnetic field (MF) in an area proximate ion emitting slit 15.

A circular or oval shaped anode 25, electrically connected to positive pole 27 of electric power source 29, is arranged in the interior of housing 3 so as to at least partially surround magnet 23 and be approximately concentric therewith. Anode 25 may be fixed inside the housing by way of ring 31 (e.g., of ceramic). Anode 25 defines a central opening 33 therein in which magnet 23 is located. Negative pole 35 of electric power source 29 is connected to housing 3 (and thus to cathode 5) generally at 37, so that the cathode and housing are grounded (GR).

Located above housing 3 (and thus above cathode 5) of the ion source of FIGS. 1–3 is vacuum deposition chamber 41. Chamber 41, used for depositing, includes evacuation port 43 that is connected to a source of vacuum (not shown). An object or substrate 45 to be treated (e.g., coated, etched, cleaned, etc.) is supported within vacuum chamber 41 above ion emitting slit 15 (e.g., by gluing it, fastening it, or otherwise supporting it on an insulator block 47). Thus, substrate 45 can remain electrically and magnetically isolated from the housing of vacuum depositing chamber 41, yet electrically connected via line 49 to negative pole 35 of power source 29. Since the interior of housing 3 can communicate with the interior of vacuum depositing chamber 41, all lines that electrically connect power source 29 with anode 25 and substrate 45 may pass into the interior of housing 3 and/or chamber 41 via conventional electrically feed through devices 51.

The conventional ion beam source of FIGS. 1–3 is intended for the formation of a unilaterally directed tubular ion beam 53, flowing in the direction of arrow 55 toward a surface of substrate 45. Ion beam 53 emitted from the area of slit 15 is in the form of a circle in the FIG. 2 embodiment and in the form of an oval (i.e., race track) in the FIG. 3 embodiment.

The ion beam source of FIGS. 1–3 operates as follows. Vacuum chamber 41 is evacuated, and a depositing gas 57 is fed into the interior of housing 3 via aperture 21. Power supply 29 is activated and an electric field is generated between anode 25 and cathode 5, which accelerates electrons 59 to high energy. Electron collisions with the gas in or proximate gap or slit 15 leads to ionization and a plasma is generated. "Plasma" herein means a cloud of gas including ions of a material to be accelerated toward substrate 45. The plasma expands and fills (or at least partially fills) a region including slit 15. An electric field is produced in slit 15, oriented in the direction of arrow 55 (substantially perpendicular to the transverse magnetic field) which causes ions to propagate toward substrate 45. Electrons in the ion acceleration space in slit 15 are propelled by the known E×B drift in a closed loop path within the region of crossed electric and magnetic field lines proximate slit 15. These circulating electrons contribute to ionization of the gas, so that the zone of ionizing collisions extends beyond the electrical gap 63 between the anode and cathode and includes the region proximate slit 15 on one and/or both sides of the cathode 5.

For purposes of example, consider the situation where a silane and/or acetylene ($C_2H_2$) depositing gas 57 is/are utilized by the ion source of FIGS. 1–3. The silane and/or acetylene depositing gas passes through the gap at 63 between anode 25 and cathode 5. Unfortunately, certain of the elements in acetylene and/or silane gas is/are insulative in nature (e.g., carbide may be an insulator in certain applications). Insulating deposits resulting from the depositing gas can quickly build up on the respective surfaces of anode 25 and/or cathode 5 proximate gap 63. This can interfere with gas flow through the gap or slit, and/or it can reduce net current thereby adversely affecting the electric field potential between the anode and cathode proximate slit 15. In either case, operability and/or efficiency of the ion beam source is adversely affected. In sum, the flow of gas which produces a substantial amount of insulative material buildup in electrical gap 63 between the anode and cathode may be undesirable in certain applications.

In view of the above, it will be apparent to those skilled in the art that there exists a need for an ion source including a more efficient gas flow design.

BRIEF SUMMARY OF THE INVENTION

In certain example embodiments of this invention, the depositing gas (e.g., acetylene, silane, and/or the like) is introduced into the ion source at least via the depositing chamber. Optionally, a maintenance gas (e.g., argon and/or another inert gas(es)) may be introduced into the ion source from the depositing chamber and/or the rear of the source. In embodiments where the maintenance gas is introduced from the rear of the source, the depositing gas and the maintenance gas may approach the ion emitting aperture defined in the cathode from opposite sides thereof. However, as mentioned above, both the depositing gas and the maintenance gas may be introduced into the source via the depositing chamber in certain embodiments.

It has been found that as a result, certain embodiments of the instant invention are advantageous in that the amount of undesirable insulative build-ups (e.g., carbon build-ups) on the anode and/or cathode of the source, especially in the region between the anode and cathode, can be reduced thereby enabling the source to work more efficiently and/or longer without having to be cleaned. In certain instances, deposition rates can also be increased.

In certain example embodiments of this invention, an insulative insert(s) and/or layer(s) may be provided between the anode and cathode on a side of the cathode opposite the depositing chamber. The provision of such an insert(s) and/or layer(s) can serve to reduce the amount of undesirable insulative build-ups (e.g., carbon build-ups) on certain interior surface areas of the anode and/or cathode, especially in the interior area between the anode and cathode.

In certain example embodiments of this invention, there is provided an ion beam source capable of emitting an ion beam toward a substrate, the ion beam source comprising: a cathode; an anode located proximate an aperture defined in the cathode, wherein an electric gap is defined between the anode and the cathode; at least one magnet for generating a magnetic field proximate the aperture defined in the cathode, wherein an ion beam is to be emitted toward a substrate from an area in and/or proximate the aperture defined in the cathode; and wherein both a depositing gas and a maintenance gas that is different than the depositing gas are both introduced into the ion beam source via a depositing chamber in which the substrate is to be located.

In certain other example embodiments of this invention, there is provided an ion beam source capable of emitting an ion beam toward a substrate, the ion beam source comprising: a cathode; an anode located proximate an aperture defined in the cathode, wherein an electric gap is defined between the anode and the cathode; at least one magnet for generating a magnetic field proximate the aperture defined in the cathode, wherein an ion beam is to be emitted toward a substrate from an area in and/or proximate the aperture defined in the cathode; an inlet for enabling introduction of at least one gas into the ion beam source via a chamber in which the substrate is to be located; and a dielectric insert and/or layer located between the anode and cathode proximate the aperture defined in the cathode.

In certain other example embodiments of this invention, there is provided a method of ion beam depositing a layer to be supported by a substrate, the method comprising: providing an ion source including a cathode, an anode located proximate an aperture defined in the cathode, and at least one magnet for generating a magnetic field proximate the aperture defined in the cathode, wherein an ion beam is emitted toward a substrate from an area in or proximate the aperture defined in the cathode; introducing both a depositing gas and a maintenance gas into the source via a depositing chamber in which the substrate is located so that both the depositing gas and the maintenance gas approach the aperture defined in the cathode from a side thereof opposite the anode; and wherein an ion beam resulting from ionization of at least part of the gases is directed toward the substrate and the layer is formed so as to be supported by the substrate.

DETAILED DESCRIPTION OF THE INVENTION

Referring now more particularly to the accompanying drawings, in which like reference numerals indicate like parts throughout the several views. Thus, reference numerals used in FIGS. 4–5, and used for the same components as discussed above with respect to FIGS. 1–3.

In the following description, for purposes of explanation and not limitation, specific details are set forth in order to provide an understanding of certain embodiments of the present invention. However, it will apparent to those skilled in the art that the present invention may be practiced in other embodiments that depart from these specific details. In other instances, detailed descriptions of well known devices, gases, fasteners, and other components/systems are omitted so as to not obscure the description of the present invention with unnecessary detail.

Figure 4:
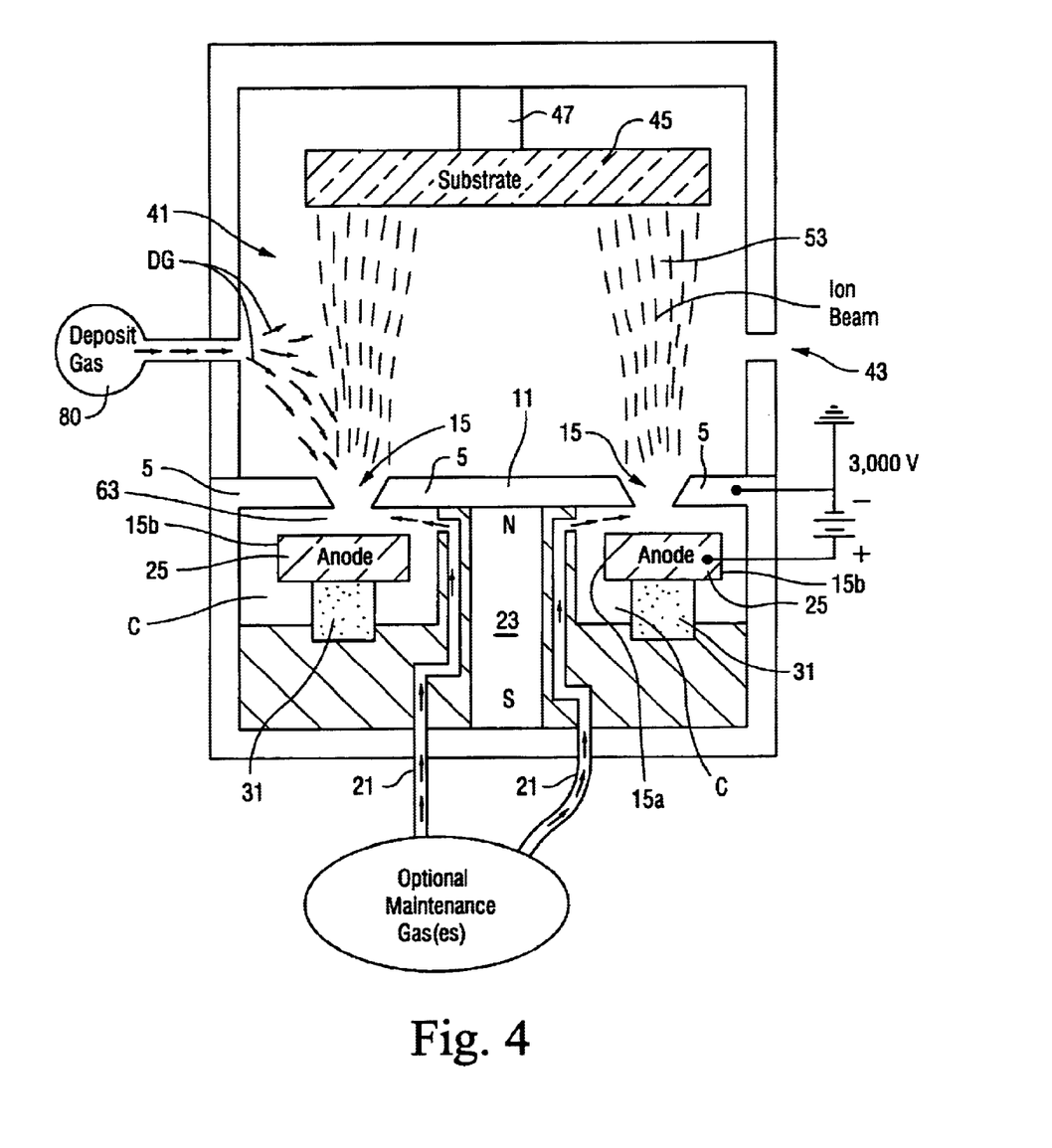
FIG. 4 is a schematic partial cross sectional view of an ion source according to an example embodiment of this invention.
Figure 5:
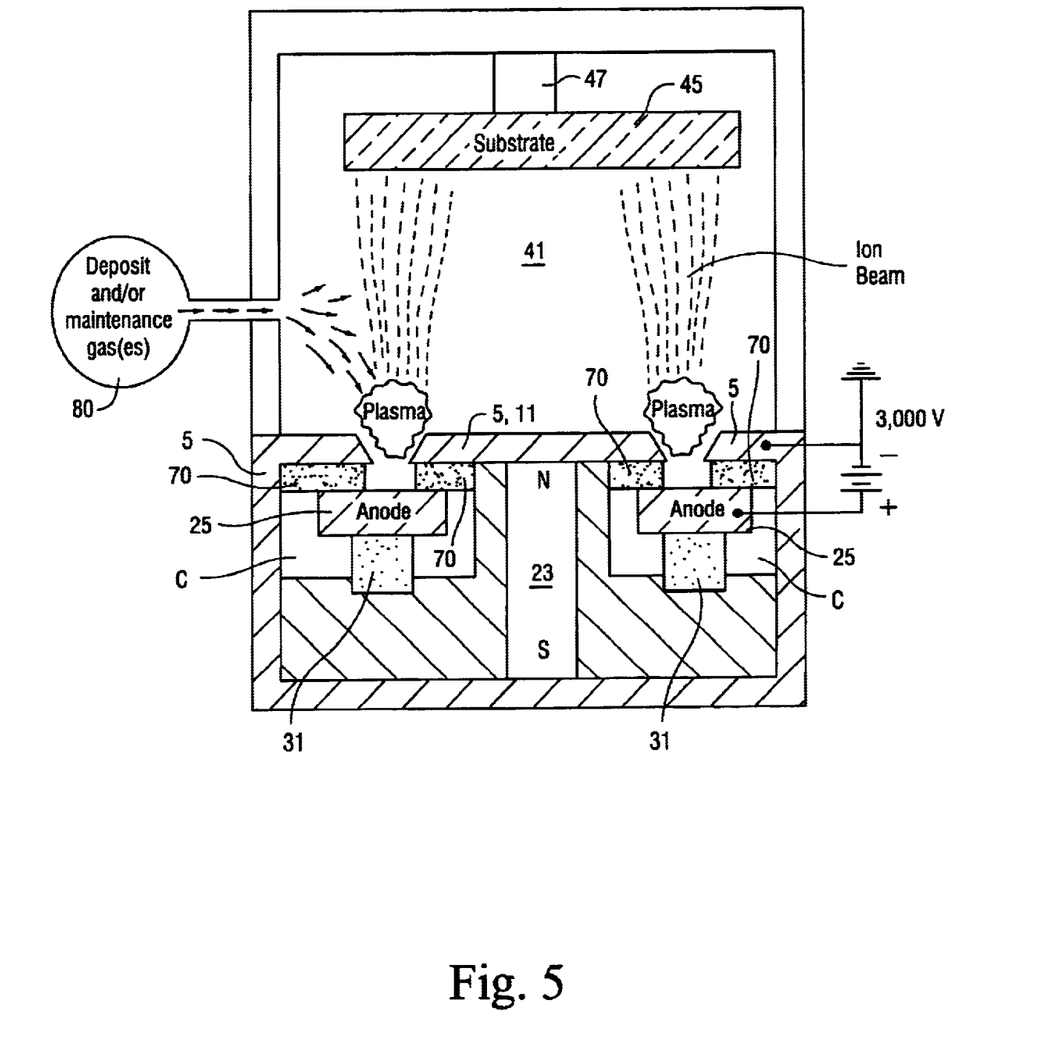
FIG. 5 is a schematic partial cross sectional view of an ion source according to another example embodiment of this invention.

FIGS. 4–5 are schematic and partial sectional views of ion sources according to different example embodiments of this invention. These cold cathode closed drift type ion sources are similar in many respects to that of FIGS. 1–3. Closed loop ion emitting slit 15 may be circular, cylindrical, rectangular, triangular, elliptical, or oval in shape according to different embodiments of this invention. Shapes herein are for purposes of example only, and are not intended to be limiting. The terms "aperture", "channel" and "slit" are used herein for purposes of convenience are not intended to be limited as to shape or size. For example, an aperture 15 herein may be of any shape or size (e.g., circular, rectangular, triangular, semi-circular, trapezoidal, channel-shaped, slit-shaped, or the like). Thus, a "slit" may be both a slit as well as an aperture herein, as may a channel. Likewise, the term "aperture" as used herein includes simple holes as well as apertures in the form of slit, channels, and the like.

The cold cathode closed drift ion sources of FIGS. 4–5 may be utilized in order to ionize gas molecules and then cause them to be accelerated and emitted as a beam 53 toward a substrate 45. This ion beam may be utilized for various technical and technological purposes, including but not limited to, cleaning the substrate, activating something on the substrate, polishing the substrate, etching a portion of the substrate, and/or depositing a thin film coating(s) and/or layer(s) on the substrate. Ion beam 53 may be focused, collimated, or diffused in different embodiments of this invention.

Anode 25 includes a body or main body defining an inner periphery 15a and an outer periphery 15b. Thus, within the main body of the anode 25 is defined an aperture in which magnet 23 is located. The inner and outer peripheries of the anode 25 may be circular, oval, elliptical, triangular, rectangular, or otherwise shaped in different embodiments of this invention. The inner and outer peripheries of the anode 25 may be concentric in certain embodiments, and non-concentric in other embodiments of this invention.

Still referring to FIGS. 4–5, in certain exemplary non-limiting embodiments of this invention, anode 25 is at a positive potential and cathode 5 is either at a grounded or negative potential relative to the anode. This causes active electrons to pass through electrical gap 63 between anode 25 and cathode 5. A magnetic field (MF) caused at least in part by magnet 23 proximate aperture/slit 15 tends to keep the active electrons proximate the slit so that they can ionize gas in the vicinity of the slit at both sides of the cathode 5 (e.g., see the MF in U.S. Pat. No. 6,359,388, hereby incorporated herein by reference in its entirety). Gas molecules and/or atoms proximate aperture/slit 15 are thus bombarded by electrons and ionized in a known manner. Because of at least the potential of anode 25, the ions are propelled (i.e., accelerated) outwardly from slit 15 in the form of a beam 53 toward substrate 45. Substrate 45 may be grounded in certain embodiments of this invention, but is not grounded in other embodiments of this invention. Example non-limiting parameters which may be used in an example embodiment are as follows: 1.8 mTorr pressure in vacuum depositing chamber 41, 180 sccm flow of acetylene gas into the chamber 41, 40 sccm flow of argon gas (maintenance gas) into the source via the chamber 41 and/or rear of the source, and 3 kV anode voltage; or alternatively in another example embodiment 1.8 mTorr pressure in vacuum depositing chamber 41, 230 sccm flow of acetylene gas into the chamber 41, 100 sccm flow of argon gas (maintenance gas) into the source via the chamber 41 and/or rear of the source, and 3 kV anode voltage.

The particular magnetic circuit illustrated in the drawings is for purposes of example only, and is not intended to be limiting. The magnet may be positioned as illustrated within the circumference of anode 25, or instead it may be provided at other locations in order to produce the transverse magnetic field proximate slit/aperture 15. In other words, there are many different ways of producing the transverse field in slit/aperture 15. For example, as an alternative to the illustrated embodiments, cylindrical magnets could be embedded in the outer cylindrical housing with all or most of the cylindrical magnets having polarities oriented in approximately the same direction and aligned along the axis of the ion source. Then, the central magnet could be replaced with magnetoconductive material, and a closed circuit (with no or minimal gaps) that connects to both surfaces defining slit/aperture 15 is still obtained.

In accordance with certain embodiments of this invention, depositing gas DG (e.g., silane, siloxane, cyclohexane, acetylene, and/or other hydrocarbon gas, etc.) is introduced into the ion source via the depositing chamber 41. In certain embodiments, when chamber 41 is used as a vacuum chamber as well as a depositing chamber, the chamber is provided at a pressure less than atmospheric during certain ion source operation(s). When it is desired to ion beam deposit a layer of diamond-like carbon (DLC) on substrate 45, the depositing gas DG will include carbon and may be of or include, for example, acetylene ($C_2H_2$) or some other hydrocarbon gas(es) (the layer to be ion beam depositing is to include material(s) from the DG). Because the depositing gas DG is introduced into the source via the vacuum depositing chamber 41 (as opposed to via the rear of the source via channel 21), ions resulting therefrom do not necessarily have to pass through slit/aperture 15 before reaching substrate 45. As explained above, at least some circulating electrons held proximate the slit/aperture 15 by the MF are located proximate the exterior of the slit ("exterior" of the slit means the side of the slit in the depositing chamber 41). These electrons located proximate the slit/aperture 15, but at the exterior side thereof, contribute to ionization of the depositing gas that is introduced into the source via the depositing chamber 41 so that at least some of the depositing gas can be ionized without having to pass through electric gap 63 and/or slit/aperture 15. In certain embodiments, such ions may be directed toward substrate 45 without necessarily having to pass through electric gap 63 and/or slit 15.

In certain embodiments of this invention, deposit gas (DG) may be introduced directly into the chamber 41 as shown in FIG. 4 and at the same time additional deposit gas (of the same or a different type as being introduced directly into chamber 41) may be introduced into the source via inlet(s) 21. Thus, it is possible to simultaneously introduce DG into the source via chamber 41 and via inlet(s) 21 in certain embodiments of this invention. In other embodiments, the DG is only introduced via chamber 41.

In certain embodiments of this invention, the depositing (or any other) gas introduced via the chamber 41 is introduced in a non-focused manner (e.g., through a pipe inlet, tube inlet, aperture inlet, or the like). Such a collimated or diffused introduction of the gas into chamber 41 may or may not be directed toward aperture 15 in different embodiments of this invention.

Introduction of the depositing gas DG into the source via vacuum depositing chamber 41 is advantageous in that it enables insulative build-ups (e.g., carbon inclusive build-ups from the depositing gas) to be reduced on surface(s) of the anode 25 and/or cathode 5, especially in interior areas proximate the electric gap 63. In certain embodiments, this may also enable the source to work more efficiently and/or longer without having to be cleaned, and/or deposition rates can be increased.

Maintenance gas (e.g., argon, krypton and/or xenon) may be utilized in combination with depositing gas DG in certain embodiments of this invention. In the FIG. 4 embodiment, the maintenance gas is introduced into the source from the rear thereof via channel 21. Thus, the maintenance gas must flow through cavity C, electric gap 63, and slit/aperture 15 before ions resulting therefrom can reach the substrate. Because the deposit build-up from the maintenance gas are less problematic than from the deposit gas, the problems discussed above are not of significant concern with respect to the maintenance gas which may even act to clean the source in certain instances. The maintenance gas may significantly contribute to the plasma generated in the vicinity of the slit/aperture 15. Depending upon the plasma proximate the gap(s) 63 and/or aperture 15, current is translated into a beam current, i.e., a flux of ions expelled outwardly in beam 53 toward the substrate. The higher the current in the gap, the greater the ion flux. Thus, it is important to control the amount of gas proximate gap 63 and/or aperture 15. As discussed above, control of the amounts of gas in gap 63 and/or aperture 15 may be achieved in part by reducing the likelihood of the buildup of insulative material in gap 63 which may reduce the flow of maintenance gas therethrough.

FIG. 5 illustrates another technique for controlling the amount of maintenance gas proximate aperture 15. In the FIG. 5 embodiment, both the depositing gas DG (including one or more gases) and the maintenance gas (including one or more gases) are introduced into the ion source via vacuum depositing chamber 41. This enables the problematic insulative build-ups on the interior surfaces of the anode/cathode proximate gap 63 to be reduced as explained above, and also permits the depositing gas DG and maintenance gas to be more uniformly mixed before and/or during ionization thereby creating a more desirable ion beam. The non-insulative maintenance gas may be utilized to control and/or determine the electrical characteristics of ion beam 53, while the depositing gas DG may be utilized to determine which ions for a layer/coating to be ion beam deposited on substrate 45 are to be expelled in beam 53 toward the substrate. It is noted that in certain embodiments of this invention, for cleaning and/or etching the substrate 45 for example, solely maintenance gas (not DG) may be used.

Certain example embodiments of this invention are surprisingly advantageous in that a higher deposition rate with higher pressure may be achievable, improved film uniformity, and/or less undesirable build-ups may be realized. In certain embodiments, the pressure in the background (i.e., chamber 41) is raised relative to conventional ion sources when the depositing gas is introduced into chamber 41 and at this higher pressure the same deposition rate can be achieved as with the lower pressure used in a conventional ion beam source. The pressure in chamber 41 may be raised, for example, from 0.5 mTorr to from about 1.5 to 2.5 mTorr.

Referring to FIG. 5, in other embodiments of this invention, a dielectric insert(s) and/or layer(s) 70 may be provided between the anode 25 and cathode 5 proximate aperture 15 and/or gap 63 in order to further reduce undesirable build-ups on the anode and/or cathode surface(s). With respect to the dielectric insert(s) and/or layer(s) 70, the term dielectric herein means not nearly as conductive as the anode and cathode, but possibly having some small bit of conductivity. Example materials for the dielectric insert(s) and/or layer(s) 70 include a ceramic, a metal boride, a nitride, and/or a carbide. Example metal borides may be borides of one or more of Ti, Zr, Ta and/or Fe. Insert(s) and/or layer(s) 70 may or may not completely surround the area immediately adjacent the aperture/slit 15 on all lateral sides thereof in different embodiments of this invention.

Dielectric insert(s) and/or layer(s) 70 may or may not contact both of the anode and cathode in different embodiments of this invention. In certain embodiments, the insert(s) and/or layer(s) 70 contacts both of the anode 25 and cathode 5 as shown in FIG. 5. The anode 25 is generally insulated from the cathode 5 and/or other parts of the source via insulator 31 and potentially via insert/ayer 70 when the insert/layer 70 contacts both the anode and cathode. However, in other embodiments, the insert(s) and/or layer(s) 70 may only be supported by and contact the anode, or alternatively may only be supported by and contact the cathode. When the insert(s) and/or layer(s) 70 contacts both the anode 25 and cathode 5 as shown in FIG. 5, and entirely surrounds the area immediately below the aperture 15 in all lateral directions, then the cavity C adjacent the anode does not receive any gas flow thereinto from any direction. However, the insert(s) and/or layer(s) 70 need not seal off the cavity C in all embodiments, and need not completely surround the area immediately below the aperture 15 in all embodiments.

Thus, when it is stated herein that a dielectric insert and/or layer 70 is provided "between" the anode 25 and cathode 5 in an area proximate the slit/aperture 15, this is intended to cover situations where the insert and/or layer contacts both the anode and cathode, as well as situations where an insert and/or layer contacts only one of but not both of the anode and cathode.

While the figures herein illustrate the substrate being located above the anode and cathode, this invention is clearly not so limited. The apparatus may of course be inverted so that the substrate is below the anode and cathode (or on a side), in different embodiments of this invention.

Figure 6:
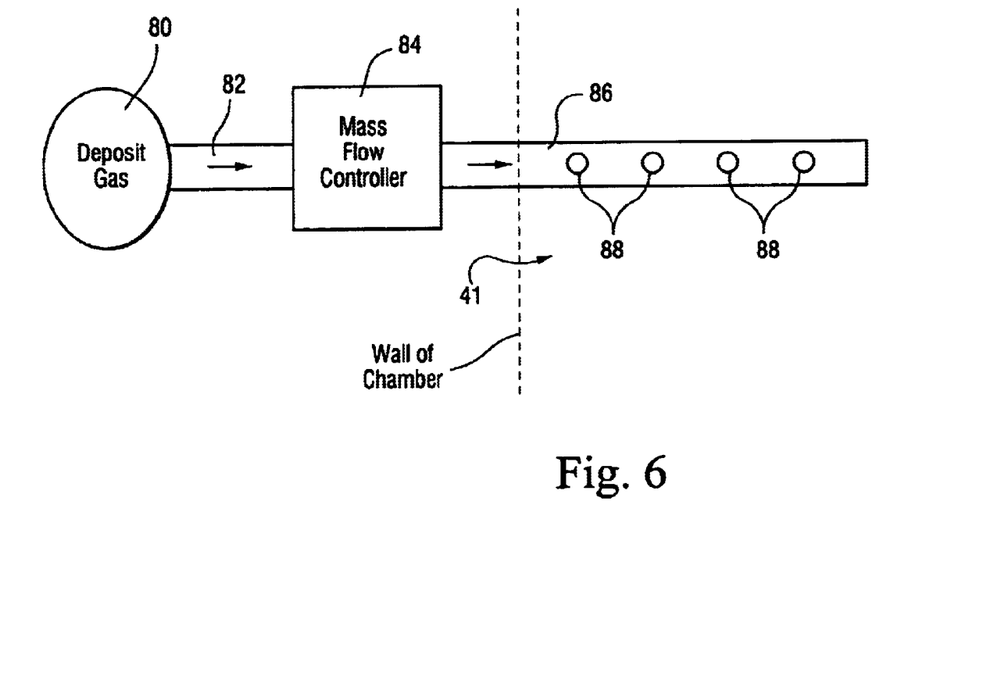
FIG. 6 is a plan view illustrating how depositing gas may be introduced directly into the depositing chamber in certain example embodiments of this invention.
Figure 7:
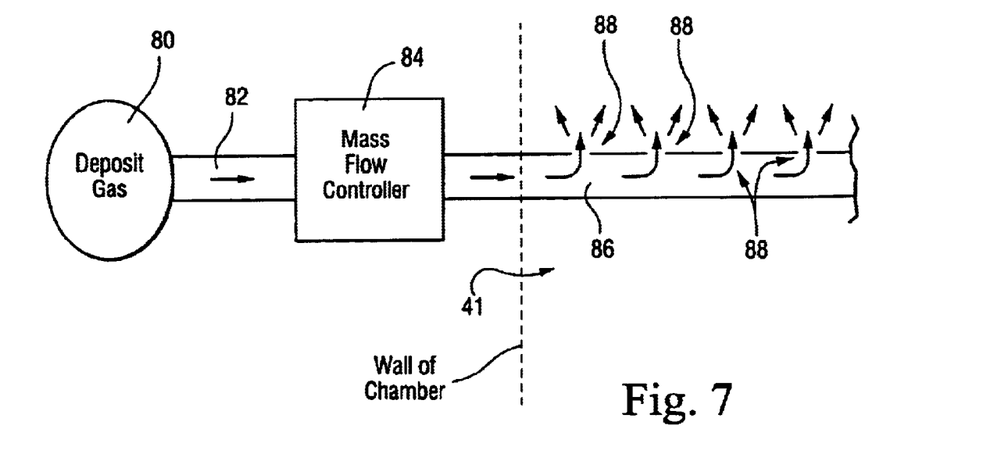
FIG. 7 is a cross sectional view of the system of FIG. 6, illustrating how depositing gas may be introduced directly into the depositing chamber in certain example embodiments of this invention.

FIGS. 6–7 illustrate how depositing gas (DG) may be introduced directly into vacuum/depositing chamber 41 in certain example embodiments of this invention. The DG is output from a tank or cylinder 80 and proceeds via conduit 82 to mass flow controller (MFC) 84. The MFC 84 regulates the gas flow in a known manner. From the MFC 84, the DG is output via conduit 86. Conduit 86 extends into chamber 41 and includes a plurality of gas output apertures 88 defined therein. The DG in conduit 86 flows through the conduit and exits the same via output apertures 88 so as to flow into depositing/vacuum chamber 41. In certain example embodiments of this invention, aperture 88 may be aligned in a direction facing the anode/cathode of the ion source (i.e., in a direction away from substrate 45). The use of apertures 88 has surprisingly been found to enable a more uniform gas flow/presence in chamber 41 which has been found to improve ion source operation.

Still referring to FIGS. 6–7, maintenance gas may also be introduced directly into chamber 41 via spaced apart gas outlet apertures 88. The maintenance gas may be introduced via the same conduit 86 as the DG, or alternatively may be introduced via a different conduit 86 having apertures 88 defined therein.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An ion beam source capable of emitting an ion beam toward a substrate, the ion beam source comprising:
    an anode and a cathode, wherein an aperture is defined in at least one of the anode and cathode;
    wherein an electric gap is defined between the anode and the cathode;
    at least one magnet for generating a magnetic field proximate the aperture, wherein an ion beam is to be emitted toward a substrate from an area in and/or proximate the aperture; and
    means for introducing both a depositing gas and a maintenance gas that is different than the depositing gas into the ion beam source via a depositing chamber in which the substrate is to be located;
    wherein the ion beam source is a cold cathode type ion source and there are no means to introduce gas from the anode side.

2. The ion beam source of claim 1, wherein at least part of both the depositing gas and the maintenance gas can be ionized without having to first pass through the electric gap between the anode and cathode, so that at least some ions resulting from each of the depositing gas and maintenance gas can be directed toward the substrate without having to pass through at least one of: (a) the electric gap provided between the anode and cathode, and (b) the aperture.

3. The ion beam source of claim 1, wherein the depositing gas comprises at least one of a silane, a siloxane, cyclohexane, and acetylene, and the maintenance gas comprises at least one of argon, krypton and xenon.

4. The ion beam source of claim 1, wherein the depositing gas comprises a hydrocarbon, and the maintenance gas comprises an inert gas.

5. The ion beam source of claim 1, further comprising a dielectric insert and/or layer located between the anode and cathode proximate the aperture in order to reduce and/or prevent insulative build-up on surface(s) of the anode and/or cathode in an area proximate the aperture.

6. The ion beam source of claim 5, wherein the dielectric insert and/or layer contacts both of the anode and cathode.

7. The ion beam source of claim 5, wherein the dielectric insert and/or layer contacts only one of the anode and cathode.

8. The source of claim 1, wherein the depositing gas is introduced into the depositing chamber via a conduit having a plurality of spaced apart gas outlet apertures defined therein, the spaced apart gas outlet apertures being located in the depositing chamber.

9. The ion beam source of claim 1, wherein the source is a cold cathode closed drift ion source.

10. The ion beam source of claim 1, wherein the aperture is defined in the cathode so as to define a slit, and wherein at least part of the anode is located below the slit.

* * * * *